(12) United States Patent
Wu et al.

(10) Patent No.: US 8,828,767 B2
(45) Date of Patent: Sep. 9, 2014

(54) FABRIATION METHOD FOR LIGHT ABSORPTION LAYER OF SOLAR CELL

(75) Inventors: Tsung-Shin Wu, Kaohsiung (TW); Shih-Hsiung Wu, Tainan (TW); Hung-Chun Pan, New Taipei (TW); Lung-Teng Cheng, Changhua County (TW); Yu-Yun Wang, Hualien County (TW)

(73) Assignee: Industrial Technology Research Institute, Hsinchu (TW)

( * ) Notice: Subject to any disclaimer, the term of this patent is extended or adjusted under 35 U.S.C. 154(b) by 102 days.

(21) Appl. No.: 13/600,787

(22) Filed: Aug. 31, 2012

(65) Prior Publication Data

US 2013/0171768 A1 Jul. 4, 2013

(30) Foreign Application Priority Data

Dec. 30, 2011 (TW) .............................. 100149770 A

(51) Int. Cl.
*H01L 21/00* (2006.01)

(52) U.S. Cl.
USPC .............................................. 438/46; 438/47

(58) Field of Classification Search
USPC ..................................................... 438/46–47
See application file for complete search history.

(56) References Cited

U.S. PATENT DOCUMENTS

| 8,409,906 B2 * | 4/2013 | Guo et al. ........................ 438/72 |
| 2009/0314342 A1 | 12/2009 | Bent et al. |
| 2010/0186805 A1 | 7/2010 | Krunks et al. |
| 2011/0094557 A1 | 4/2011 | Mitzi et al. |
| 2011/0097496 A1 | 4/2011 | Mitzi et al. |
| 2011/0139071 A1 | 6/2011 | Oladeji |

FOREIGN PATENT DOCUMENTS

| CN | 101026198 A | 8/2007 |
| CN | 101299366 A | 11/2008 |
| CN | 101659394 A | 3/2010 |
| CN | 101798108 A | 8/2010 |
| CN | 101844797 A | 9/2010 |
| TW | 201107241 A1 | 3/2011 |
| TW | 201117412 A | 5/2011 |
| TW | 201125148 A | 7/2011 |
| WO | WO-2011016283 A1 | 2/2011 |

OTHER PUBLICATIONS

Qijie Guo et al., "Fabrication of 7.2% Efficient CZTSSe Solar Cells Using CZTS Nanocrystals", J. Am. Chem. Soc., 2010, pp. 17384-17386, Issue 132.

Qijie Guo et al, "Synthesis of Cu2ZnSnS4 Nanocrystal Ink and Its Use for Solar Cells", J. Am. Chem. Soc., 2009, pp. 11672-11673, Issue 131.

T.Todorov et al., "Cu2ZnSnS4 films deposited by a soft-chemistry method", Thin Solid Films, 2009, pp. 2541-2544, Issue 517, Elsevier.

(Continued)

*Primary Examiner* — Richard Booth
(74) *Attorney, Agent, or Firm* — Muncy, Geissler, Olds & Lowe, P.C.

(57) ABSTRACT

The disclosure discloses a fabrication method for a light absorption layer of a solar cell, including: forming a precursor film on a substrate, wherein the precursor film includes the Group IB-IIB-IVA-VIA amorphous nanoparticles; and conducting a thermal process to the precursor film to form the light absorption layer on the substrate.

12 Claims, 5 Drawing Sheets

(56) References Cited

OTHER PUBLICATIONS

Tatsuya Kameyama et al., "Preparation and photoelectrochemical porperties of densely immobilized Cu2ZnSnS4 nanaparticle films", J. Mater. Chem., 2010, pp. 5319-5324, Issue 20.

Zhihua Zhou et al, "Fabrication of Cu2ZnSnS4 screen printed layers for solar cells", Solar Energy Materials & Solar Cells, 2010, pp. 2042-2045, Issue 94, Elsevier.

Chet Steinhagen et al., "Synthesis of Cu2ZnSnS4 Nanocrystals for Use in Low-Cost Photovoltaics", J. Am. Chem. Soc., 2009, pp. 12554-12555, Issue 131.

Toshiyuki Nomura et al., "Precipitation of Zinc Sulfide Particles from Homogenious Solutions", Journal of Colloid and Interface Science, 2000, pp. 179-184, Issue 223.

Shannon C. Riha et al., "Solution-Based Synthesis and Characterization of Cu2ZnSnS4 Nanocrystals", J. Am, Chem. Soc., 2009, pp. 12054-12055, Issue 131.

Rachmat Adhi Wibowo et al., "Synthesis of Cu2ZnSnSe4 compound powders by solid state reaction using elemental powders", Journal of Physics and Chemistry of Solids, 2010, pp. 1702-1706, Issue 71, Elsevier.

K. Timmo et al., "Sulfur-containing Cu2ZnSnSe4 monograin powerders for solar cells", Solar Energy Materials & Solar Cells, 2010, pp. 1889-1892, Issue 94, Elsevier.

Yan-Li Zhou et al., "Sphere-like kesterite Cu2ZnSnS4 nanoparticles synthesized by a facile solvothermal method", Materials Letters, 2011, pp. 1535-1537, Issue 65, Elsevier.

Office Action issued on May 8, 2014 of corresponding TW Application No. 100149770.

* cited by examiner

FABRIATION METHOD FOR LIGHT ABSORPTION LAYER OF SOLAR CELL

CROSS REFERENCE TO RELATED APPLICATIONS

This Application claims priority of Taiwan Patent Application No. 100149770, filed on Dec. 30, 2011, the entirety of which is incorporated by reference herein.

TECHNICAL FIELD

The present disclosure relates to a fabricating method for a light absorption layer of a solar cell, and in particular relates to a fabricating method for a light absorption layer of a compound thin film solar cell.

BACKGROUND

Technological development in the solar cell industry is driven by global environmental concerns and raw material prices. Among the various solar cells developed, compound thin film solar cells have become the subject of considerable interest due to high conversion efficiency, high stability, low cost, and large area fabrication ability.

For various compound thin film solar cells, the CIGS thin film ($Cu(In,Ga)Se_2$) solar cells have been developed firstly. Because indium (In) and gallium (Ga) are expensive rare elements, the CZTS ($Cu_2ZnSnS_4$) thin film solar cell has been developed.

In a conventional method for forming the compound thin film, a precursor is firstly made from the alloy or compounds, and then a thermal process is conducted to form a desirable thin film. Because the alloy or compounds have an inherent crystalline structure, the thermal process is conducted at a high temperature to destroy the inherent crystalline structure.

Therefore, there is a need to develop a fabricating method for a light absorption layer of a compound thin film solar cell. If the temperature of the thermal process in the fabricating method can be reduced, the cost and time of the fabricating method may also be reduced.

SUMMARY

The present disclosure provides a fabrication method for a light absorption layer of a solar cell, comprising: forming a precursor film on a substrate, wherein the precursor film comprises the Group IB-IIB-IVA-VIA amorphous nanoparticles; and conducting a thermal process to the precursor film to form the light absorption layer on the substrate.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

Figure 1:
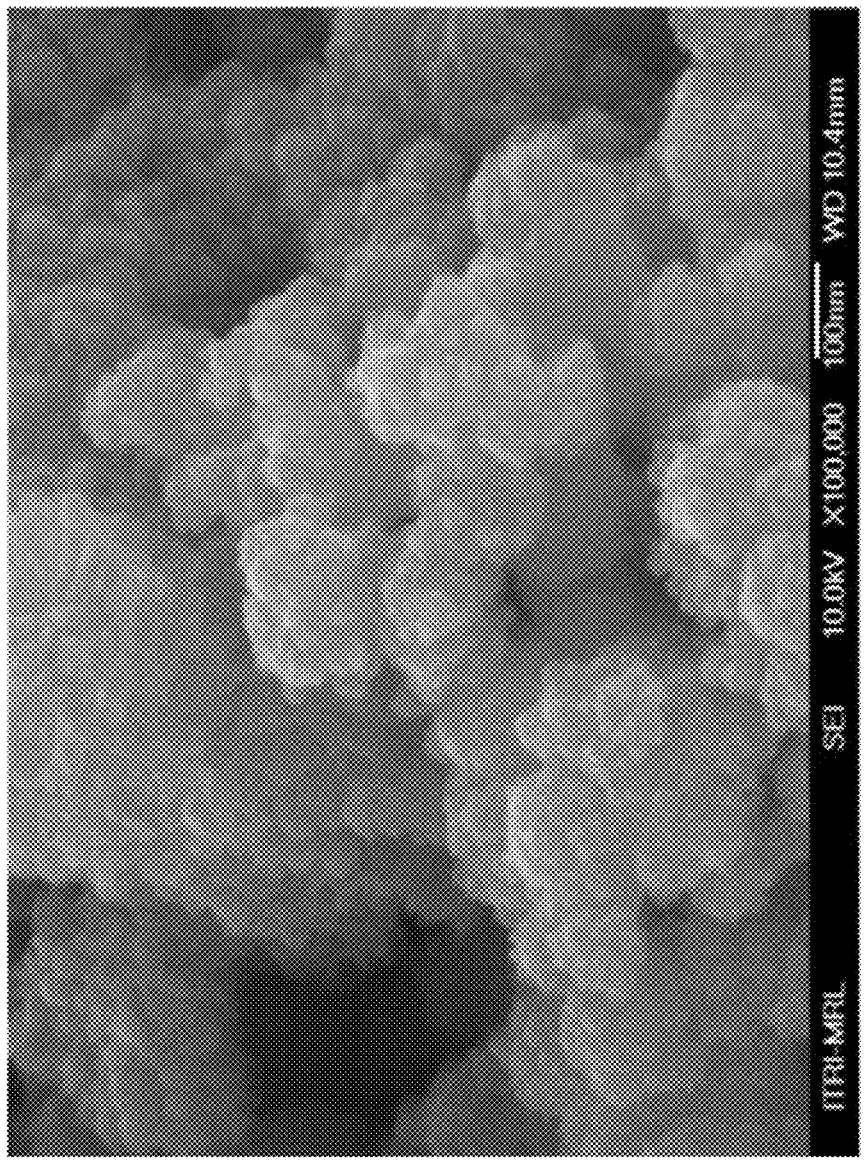
FIG. 1 shows a scanning electron microscope (SEM) image of the CZTS amorphous nanoparticles in accordance with an embodiment of the disclosure.

In the following detailed description, for purposes of explanation, numerous specific details are set forth in order to provide a thorough understanding of the disclosed embodiments. This description is made for the purpose of illustrating the general principles of the disclosure and should not be taken in a limiting sense.

The disclosure provides a fabrication method for a light absorption layer of a solar cell comprising the following steps. Firstly, a precursor film is formed on a substrate, wherein the precursor film comprises the Group IB-IIB-IVA-VIA amorphous nanoparticles. The term of "amorphous" as used herein refers to the lack of a regular internally ordered arrangement of the nanoparticles. The substrate comprises molybdenum (Mo), silver (Ag), aluminum (Al) or combinations thereof.

The precursor film is formed by a spin coating, brush coating, knife coating, spraying or printing method. Note that the precursor film may also be formed in an atmospheric environment.

Then, a thermal process is conducted to the precursor film to form a light absorption layer on the substrate. The thermal process in one embodiment is conducted at about 200° C.-500° C., and in another embodiment is about 250° C.-475° C., and yet another embodiment is about 300° C.-450° C. The thermal process in one embodiment is conducted for 20 minutes-4 hours, in another embodiment is about 30 minutes-3 hours, and yet another embodiment is about 45 minutes-2 hours. The thermal process is conducted in an atmosphere comprising inert gas, gas containing sulfur (S), gas containing selenium (Se) or combinations thereof.

In one embodiment, the precursor film is formed by the following steps (a)-step (c). In step (a), a slurry is firstly provided and the slurry comprises Group IB-IIB-IVA-VIA amorphous nanoparticles. The solvent of the slurry comprises water, alcohol-like solvent, amine solvent or combinations thereof. Additionally, a dispersant agent may be added into the slurry to help the amorphous nanoparticles disperse well in the solvent. The dispersant agent may be an organic compound having at least two amine groups, or having at least one hydroxyl (—OH) group and at least one amine group. The dispersant agent comprises methanol amine, diethanolamine, triethanolamine, hydrazine, hydrazine monohydrate or the like. Note that the amorphous nanoparticles are dispersed in the solvent rather than dissolved in the solvent.

Then, the method continues to step (b), wherein the slurry is coated on the substrate. Then, the method continues to step (c), wherein the substrate is dried to form the precursor film on the substrate. The drying temperature is about 10° C.-85° C.

The amorphous nanoparticles are formed by one kind of nanoparticle, two kinds of nanoparticles or three kinds of nanoparticles. The amorphous nanoparticles in one embodiment have a diameter of about 10 nm-10 μm, in another embodiment have a diameter of about 1 μm-15 μm, and in yet another embodiment have a diameter of about 50 nm-0.5 μm.

For example, the IB-IIB-IVA-VIA amorphous nanoparticles are Cu—Zn—Sn—S. In one embodiment, when the amorphous nanoparticles are formed by two kinds of nanoparticles, the first kind is made by Group IB elements and Group VIA elements, and the second kind is made by Group IIB elements, Group IVA elements and Group VIA elements.

In another embodiment, when the amorphous nanoparticles are formed by two kinds of nanoparticles, the first kind is made by Group IB elements, Group IVA elements and Group VIA elements, and the second kind is made by Group IIB elements, Group IVA elements and Group VIA elements.

In yet another embodiment, when the amorphous nanoparticles are formed by two kinds of nanoparticles, the first kind is made by Group IB elements, Group IIB elements and Group VIA elements, and the second kind is made by Group IVA elements and Group VIA elements.

In still another embodiment, when the amorphous nanoparticles are formed by three kinds of nanoparticles, the first kind is made by Group IB elements and Group VIA elements, and the second kind is made by Group IIB elements and Group VIA elements, and the third kind is made by Group IVA elements and Group VIA elements.

Note that there is a specific ratio between these elements. The Group IB element to the sum of the Group IIB element and Group IVA element in one embodiment has a ratio of about 0.6-0.99, in another embodiment has a ratio of about 0.75-0.95, and in yet another embodiment has a ratio of about 0.8-0.9.

The Group IB element to the Group IVA element in one embodiment has a ratio of about 1.8-2.2, in another embodiment has a ratio of about 1.85-2.15, and in yet another embodiment has a ratio of about 1.9-2.1.

The Group IIB element to the Group IVA element has a ratio of about 0.9-1.5, in another embodiment has a ratio of about 1-1.4, and in yet another embodiment has a ratio of about 1.1-1.3.

The Group IVA element to the Group IB-IIB-IVA-VIA amorphous nanoparticles in one embodiment is about 0.5-0.6, in another embodiment is about 0.505-0.55, and in yet another embodiment is about 0.51-0.53.

The Group IB-IIB-IVA-VIA amorphous nanoparticles are formed by a chemical bath reaction synthesis (CBRS) method. During the CBRS method, the reaction rate of the cation (such as $Cu^{2+}$, $Zn^{2+}$, $Sn^{4+}$) is close to that of the anions (such as $S^{-2}$). The cations and anions are arranged disorderly to form a chemical disturbing situation, and thus amorphous nanoparticles having no specific crystalline arrangement are formed.

The chemical bath reaction synthesis (CBRS) method is described as following. The Group IB ion, Group IIB ions, Group IVA ions, Group VIA ions and a pH controller agent are mixed to form a mixed solution. The pH controller agent comprises inorganic acids (such as hydrogen chloride or sulfuric acid) or organic acids (such as tartaric acid or succinic acid). The mixed solution is reacted at about 80° C.-200° C. for 0.5-4 hours to form the amorphous nanoparticles.

Note that when the amorphous nanoparticles are coated on the substrate, the thermal process may be conducted at a lower temperature (lower than 500° C.) to form the light absorption layer due to the amorphous nanoparticles having no specific crystalline arrangement.

The result of the X-ray diffraction (XRD) analysis shows that the light absorption layer formed by the above-mentioned method have kesterite structures. Furthermore, a buffer layer, a transparent conducting layer and an upper electrode are sequential formed on the light absorption layer to form a CZTS solar cell. The experimental data shows that the CZTS solar cell has a photoelectric conversion efficiency (%) of about 0.5-2.5%.

EXAMPLE

Example 1

(1) Formation of the CZTS Amorphous Nanoparticles 0.2 M $CuCl_2$, 0.15 M $ZnCl_2$, 0.45 M $SnCl_2$, 0.9 M SC$(NH)_2(CH_3)$ and 0.1% HCl were mixed to form a mixed solution. The mixed solution was reacted in a water bath at 150° C. for 60 minutes. Then, the CZTS amorphous nanoparticles were obtained after a centrifugation and drying process.

(2) Formation of the Light Absorption Layer

The CZTS amorphous nanoparticles of Example 1 were added into a hydrazine solution (30%) to form a slurry. The slurry was coated on a molybdenum (Mo) substrate. Then, a thermal process was conducted to the Mo substrate and the CZTS amorphous nanoparticles in an atmosphere comprising sulfur (S) at 400° C. for 60 minutes to form the light absorption layer.

FIG. 1 shows a scanning electron microscope (SEM) image of the CZTS amorphous nanoparticles of Example 1. As shown in FIG. 1, the CZTS amorphous nanoparticles have no specific crystalline arrangement.

Figure 2:
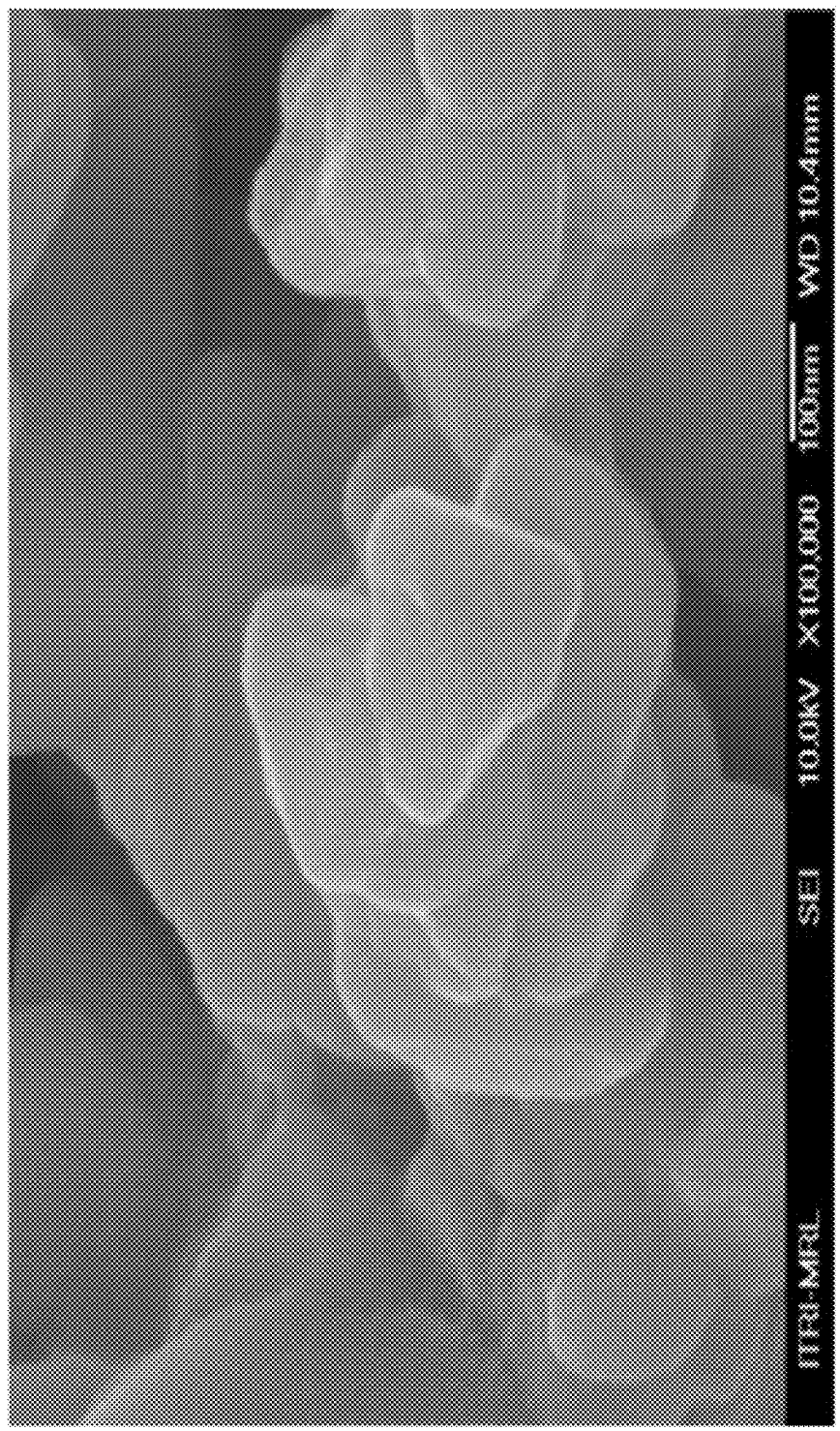
FIG. 2 shows a scanning electron microscope (SEM) image of the light absorption layer in accordance with an embodiment of the disclosure.

FIG. 2 shows a scanning electron microscope (SEM) image of the light absorption layer of Example 1. As shown in FIG. 2, the light absorption layer have grain structures.

Figure 3:
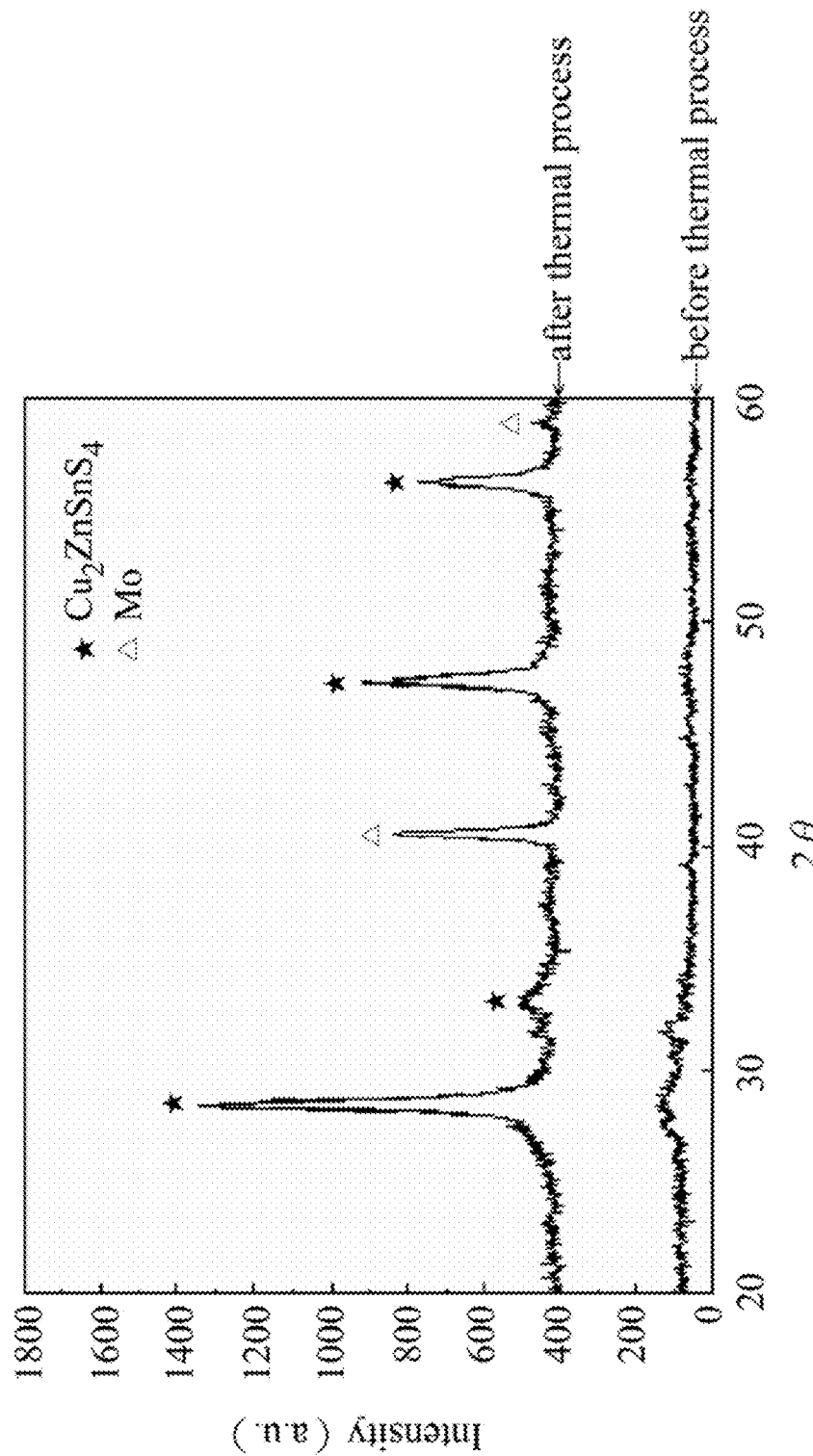
FIG. 3 shows the X-ray diffraction (XRD) data of the light absorption layer before thermal process and after the thermal process.

FIG. 3 shows the X-ray diffraction (XRD) data of the light absorption layer treated before thermal process and after the thermal process. As shown in FIG. 3, after the thermal process, the light absorption layer has kesterite structures.

(3) Formation of the Solar Cell

CdS (as the buffer layer), iZnO/AZO (as the transparent conducting layer) and an upper electrode were sequential formed on the light absorption layer of Example 1 to form a solar cell.

Figure 4:
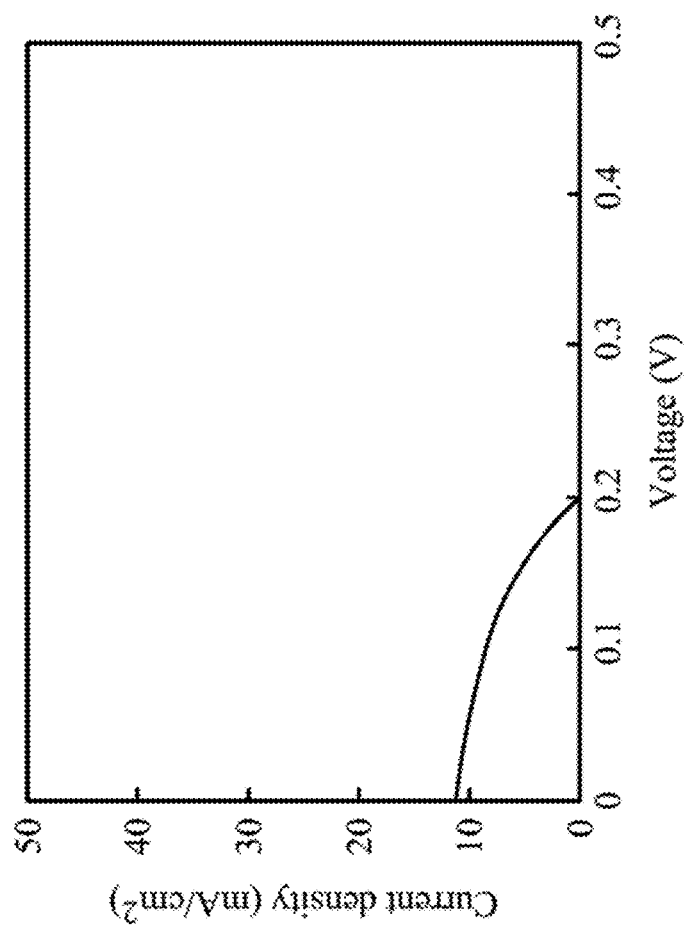
FIG. 4 shows the relationship between the cell voltage and current density of the solar cell in accordance with an embodiment of the disclosure.

FIG. 4 shows the relationship between the cell voltage and current density of the solar cell of Example 1, and the solar cell has a photoelectric conversion efficiency (%) of about 1.92%.

Example 2

(1) Formation of the CZTS Amorphous Nanoparticles

The experimental condition of the Example 2 was the same as that of the Example 1, except that 0.1 M tartaric acid was used instead of 0.1% HCl. The mixed solution was reacted in a water bath at 150° C. for 60 minutes. Then, the CZTS amorphous nanoparticles were obtained after a centrifugation and drying process.

(2) Formation of the Light Absorption Layer

The CZTS amorphous nanoparticles of Example 2 were added into the hydrazine solution (30%) to form a slurry. The slurry was coated on a molybdenum (Mo) substrate. Then, a thermal process was conducted to the Mo substrate and the CZTS amorphous nanoparticles in an atmosphere comprising sulfur (S) at 400° C. for 120 minutes to form the light absorption layer.

Example 3

(1) Formation of the CZTS Amorphous Nanoparticles

The experimental condition of the Example 3 was the same as that of the Example 1, except that 0.2 M tartaric acid was used instead of 0.1% HCl. The mixed solution was reacted in a water bath at 180° C. for 45 minutes. Then, the CZTS amorphous nanoparticles were obtained after a centrifugation and drying process.

(2) Formation of the Light Absorption Layer

The CZTS amorphous nanoparticles of Example 3 were added into the diethanolamine (5%) solution to form a slurry. The slurry was coated on a molybdenum (Mo) substrate. Then, a thermal process was conducted to the Mo substrate and the CZTS amorphous nanoparticles in an atmosphere comprising sulfur (S) at 400° C. for 20 minutes to form the light absorption layer.

Example 4

(1) Formation of the CZTS Amorphous Nanoparticles

The experimental condition of the Example 4 was the same as that of the Example 1, except that the $CuSO_4$, $ZnSO_4$ and $SnSO_4$ were used instead of $CuCl_2$, $ZnCl_2$ and $SnCl_2$. The mixed solution was reacted in a water bath at 170° C. for 60 minutes. Then, the CZTS amorphous nanoparticles were obtained after a centrifugation and drying process.

(2) Formation of the Light Absorption Layer

The CZTS amorphous nanoparticles of Example 4 were added into the triethanolamine (2%) solution to form a slurry. The slurry was coated on a molybdenum (Mo) substrate. Then, a thermal process was conducted to the Mo substrate and the CZTS amorphous nanoparticles in an atmosphere comprising sulfur (S) at 400° C. for 180 minutes to form the light absorption layer.

(3) Formation of the Solar Cell

CdS (as buffer layer), iZnO/AZO (as a transparent conducting layer) and an upper electrode were sequential formed on the light absorption layer of Example 4 to form a solar cell.

Figure 5:
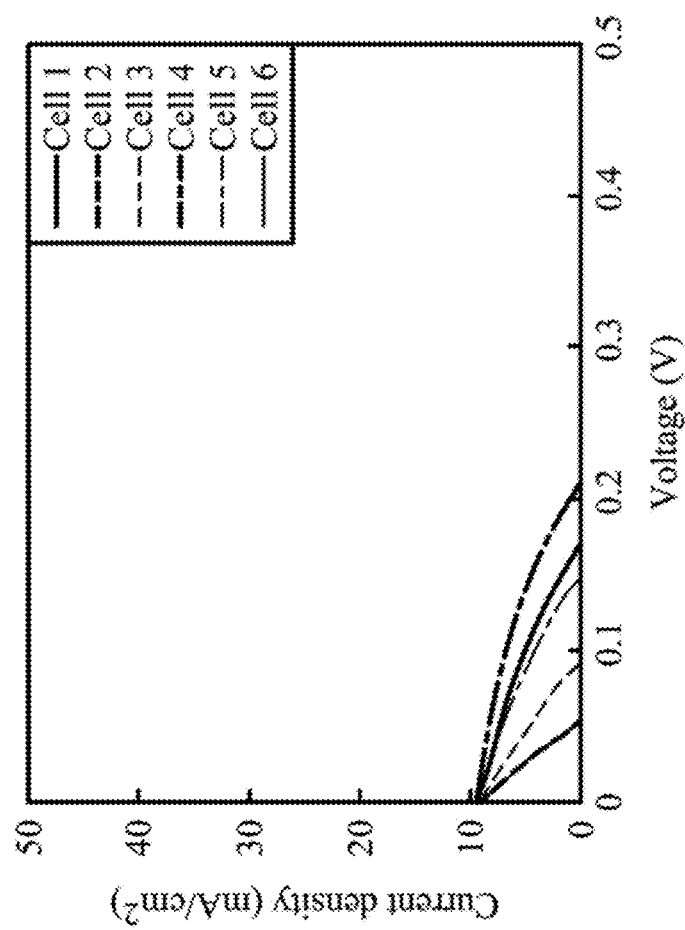
FIG. 5 shows the relationship between the cell voltage and current density of the solar cell in accordance with an embodiment of the disclosure.

FIG. 5 shows the relationship between the cell voltage and current density of the solar cell of Example 4. The solar cell was divided into six smaller solar cells (Cell 1-Cell 6). The smaller solar cell had an average photoelectric conversion efficiency (%) of about 0.7%.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a light absorption layer of a solar cell, comprising:
    forming a precursor film on a substrate, wherein the precursor film comprises the Group IB-IIB-IVA-VIA amorphous nanoparticles, and the Group IB-IIB-IVA-VIA amorphous nanoparticles are formed by a chemical bath reaction synthesis (CBRS) method; and
    conducting a thermal process to the precursor film to form the light absorption layer on the substrate.

2. The fabrication method for a light absorption layer of a solar cell as claimed in claim 1, wherein the precursor film is formed by a spin coating, brush coating, knife coating, spraying or printing method.

3. The fabrication method for a light absorption layer of a solar cell as claimed in claim 1, wherein forming the precursor film on the substrate comprises:
    providing a slurry, wherein the slurry comprises the amorphous nanoparticles;
    coating the slurry on the substrate; and
    drying the substrate to form the precursor film on the substrate.

4. The fabrication method for a light absorption layer of a solar cell as claimed in claim 1, wherein the substrate comprises molybdenum (Mo), silver (Ag), aluminum (Al) or combinations thereof.

5. The fabrication method for a light absorption layer of a solar cell as claimed in claim 1, wherein the amorphous nanoparticles are formed by one kind of nanoparticle, two kinds of nanoparticles or three kinds of nanoparticles.

6. The fabrication method for a light absorption layer of a solar cell as claimed in claim 1, wherein the Group IB element to the sum of the Group IIB element and Group IVA element has a ratio of about 0.6-0.99.

7. The fabrication method for a light absorption layer of a solar cell as claimed in claim 1, wherein the Group IB element to the Group IVA element has a ratio of about 1.8-2.2.

8. The fabrication method for a light absorption layer of a solar cell as claimed in claim 1, wherein the Group IIB element to the Group IVA element has a ratio of about 0.9-1.5.

9. The fabrication method for a light absorption layer of a solar cell as claimed in claim 1, wherein the Group VIA element to the Group IB-IIB-IVA-VIA amorphous nanoparticles is about 0.5-0.6.

10. The fabrication method for a light absorption layer of a solar cell as claimed in claim 1, wherein the thermal process is conducted at about 200° C.-500° C.

11. The fabrication method for a light absorption layer of a solar cell as claimed in claim 1, wherein the thermal process is conducted for about 20 minutes-4 hours.

12. The fabrication method for a light absorption layer of a solar cell as claimed in claim 1, wherein the thermal process is conducted in an atmosphere comprising inert gas, gas containing sulfur (S), gas containing selenium (Se) or combinations thereof.

* * * * *